United States Patent
Gilbert et al.

(10) Patent No.: US 10,541,667 B2
(45) Date of Patent: Jan. 21, 2020

(54) SURFACE ACOUSTIC WAVE (SAW) RESONATOR HAVING TRAP-RICH REGION

(71) Applicant: Avago Technologies International Sales Pte. Limited, Singapore (SG)

(72) Inventors: Stephen Roy Gilbert, San Francisco, CA (US); Richard C. Ruby, Menlo Park, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 353 days.

(21) Appl. No.: 15/245,392

(22) Filed: Aug. 24, 2016

(65) Prior Publication Data

US 2017/0063332 A1 Mar. 2, 2017

Related U.S. Application Data

(63) Continuation-in-part of application No. 14/835,679, filed on Aug. 25, 2015, now Pat. No. 10,020,796, and
(Continued)

(51) Int. Cl.
*H03H 9/02* (2006.01)
*H03H 9/64* (2006.01)

(52) U.S. Cl.
CPC .... *H03H 9/02574* (2013.01); *H03H 9/02818* (2013.01); *H03H 9/02866* (2013.01); *H03H 9/6483* (2013.01)

(58) Field of Classification Search
CPC .......... H03H 9/02543; H03H 9/02566; H03H 9/02574; H03H 9/02818; H03H 9/02952;
(Continued)

(56) References Cited

U.S. PATENT DOCUMENTS

| 5,059,847 A | 10/1991 | Tanaka et al. |
| 6,259,186 B1 | 7/2001 | Shibata et al. |

(Continued)

FOREIGN PATENT DOCUMENTS

| JP | 363067809 A | 3/1988 |
| JP | 405063500 A | 3/1993 |
| WO | WO 2016/087728 A1 * | 6/2016 |

OTHER PUBLICATIONS

B. Rong et al.; "Surface-Passivated High-Resistivity Silicon Substrates for RFICs"; IEEE Electron Device Letters, vol. 25, No. 4, Apr. 2004, pp. 176-178.*

(Continued)

*Primary Examiner* — Barbara Summons
(74) *Attorney, Agent, or Firm* — Sheridan Ross P.C.

(57) ABSTRACT

A surface acoustic wave (SAW) resonator device includes a semiconductor substrate having a first surface and a second surface. The semiconductor substrate comprises a bulk region, and a surface region. The surface region has a high trap density, and a reduced carrier mobility, compared to the bulk region. A piezoelectric layer, having a first surface and a second surface, is disposed over the semiconductor substrate. A plurality of electrodes are disposed over the first surface of the piezoelectric layer, and the plurality of electrodes are configured to generate surface acoustic waves in the piezoelectric layer. The SAW resonator device also comprises a layer disposed between the first surface of the semiconductor substrate and the second surface of the piezoelectric layer.

34 Claims, 6 Drawing Sheets

Related U.S. Application Data a continuation-in-part of application No. 14/866,394, filed on Sep. 25, 2015, and a continuation-in-part of application No. 15/009,801, filed on Jan. 28, 2016, now Pat. No. 9,991,870.

(58) Field of Classification Search
CPC ........ H03H 9/058; H03H 9/64; H03H 9/6483; H01L 41/081; H01L 41/0815
USPC .................................................. 333/193–196
See application file for complete search history.

(56) References Cited

U.S. PATENT DOCUMENTS

| | | | |
|---|---|---|---|
| 7,728,485 | B2 | 6/2010 | Handtmann et al. |
| 8,866,365 | B2* | 10/2014 | Hori ........................ H03H 3/02 310/313 R |
| 9,243,316 | B2 | 1/2016 | Larson, III et al. |
| 2003/0022412 | A1 | 1/2003 | Higgins et al. |
| 2004/0226162 | A1* | 11/2004 | Miura ...................... H03H 3/08 29/594 |
| 2014/0210317 | A1* | 7/2014 | Tai ...................... H01L 41/0838 310/348 |
| 2015/0014795 | A1* | 1/2015 | Franosch .............. H01L 21/304 257/416 |
| 2015/0069882 | A1 | 3/2015 | Umeda et al. |
| 2015/0171823 | A1 | 6/2015 | Brawley |
| 2017/0033764 | A1* | 2/2017 | Inoue ................. H03H 9/02574 |
| 2017/0063332 | A1 | 3/2017 | Gilbert et al. |
| 2017/0331501 | A1* | 11/2017 | Kononchuk ...... H01L 21/02378 |

OTHER PUBLICATIONS

D. C. Kerr et al.; "Identification of RF Harmonic Distortion on Si Substrates and its Reduction Using a Trap-Rich Layer"; published in 2008 IEEE Topical Meeting on Silicon Monolithic Integrated Circuits in RF Systems, date of conference Jan. 23-25, 2008, pp. 151-154.*
K. B. Ali et al.; "Ultrawide Frequency Range Crosstalk Into Standard and Trap-Rich High Resistivity Silicon Substrates"; IEEE Transactions on Electron Devices, vol. 58, No. 12, Dec. 2011, pp. 4258-4264.*
U.S. Appl. No. 14/835,679, filed Aug. 25, 2015.
U.S. Appl. No. 14/866,394, filed Sep. 25, 2015.
U.S. Appl. No. 15/009,801, filed Jan. 28, 2016.
English language machine translation of JP 63-067809 A, published Mar. 26, 1988, 2 pages.
English language machine translation of JP 05-063500 A, published Mar. 12, 1993, 2 pages.
A. Fardeheb-Mammeri et al.; "Growth of Inclined C-axis AlN Films in Planar System for BAW Devices"; Journal of Electron Devices, vol. 5, 2007, pp. 132-137.
Kochar et al., "NSPUDT using C-Axis tilted ScAlN Thin Film", Frequency Control Symposium and the European Frequency and Time Forum (FCS), 2015 Joint Conference of the IEEE International, Apr. 2015.

* cited by examiner

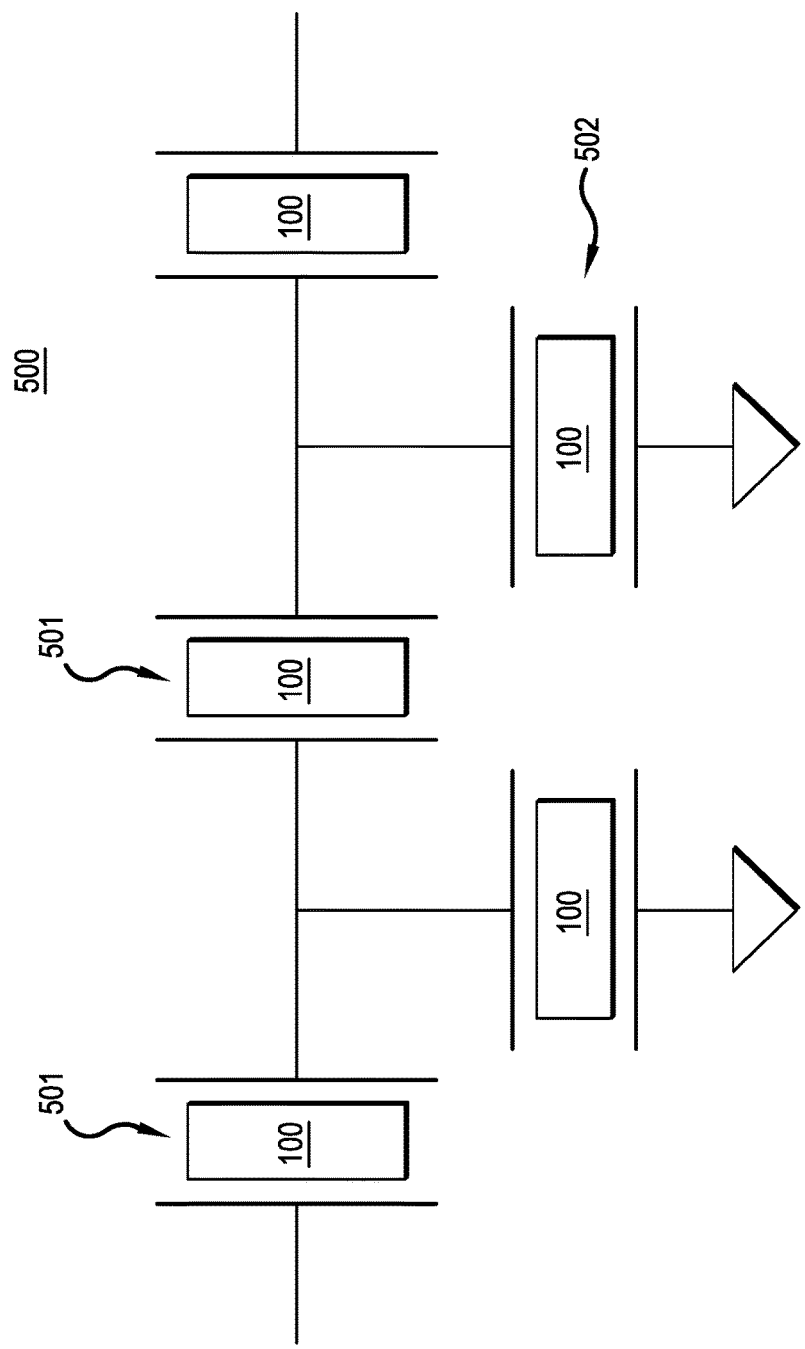

SURFACE ACOUSTIC WAVE (SAW) RESONATOR HAVING TRAP-RICH REGION

CROSS REFERENCE TO RELATED APPLICATIONS

This application is a continuation-in-part under 37 C.F.R. § 1.53(b) of, and claims priority under 35 U.S.C. § 120 from, U.S. patent application Ser. No. 14/835,679 filed on Aug. 25, 2015, naming Stephen Roy Gilbert, et al. as inventors; Ser. No. 14/866,394 filed on Sep. 25, 2015 naming Stephen Roy Gilbert, et al. as inventors; and Ser. No. 15/009,801, filed on Jan. 28, 2016, naming Stephen Roy Gilbert, et al. as inventors. The entire disclosures of U.S. patent application Ser. Nos. 14/835,679, 14/866,394, and 15/009,801 are specifically incorporated herein by reference.

BACKGROUND

Electrical resonators are widely incorporated in modern electronic devices. For example, in wireless communications devices, radio frequency (RF) and microwave frequency resonators are used in filters, such as filters having electrically connected series and shunt resonators forming ladder and lattice structures. The filters may be included in a duplexer (diplexer, triplexer, quadplexer, quintplexer, etc.) for example, connected between an antenna (there could be several antennas like for MIMO) and a transceiver for filtering received and transmitted signals.

Various types of filters use mechanical resonators, such as surface acoustic wave (SAW) resonators. The resonators convert electrical signals to mechanical signals or vibrations, and/or mechanical signals or vibrations to electrical signals.

SAW resonators can be provided over high-resistivity, monocrystalline silicon substrates, so that radio-frequency (RF) losses due to currents in the substrate generated by electric fields from the electrodes are mitigated. However, in spite of the use of a high-resistivity, undoped monocrystalline silicon substrate, an inversion channel can be formed due to charges in other layers in the SAW structure. Carriers in the substrate, in turn, can be injected into the inversion layer. Spurious currents can result from these charges due to the electric fields generated by the electrodes. Thus, in known SAW structures, RF losses due to spurious currents can remain.

What is needed, therefore, is a SAW resonator device that overcomes at least the shortcomings of known SAW resonators described above.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

FIG. 5 is a simplified schematic block diagram of a filter comprising SAW resonator devices, according to a representative embodiment.

DETAILED DESCRIPTION

Figure 1A:
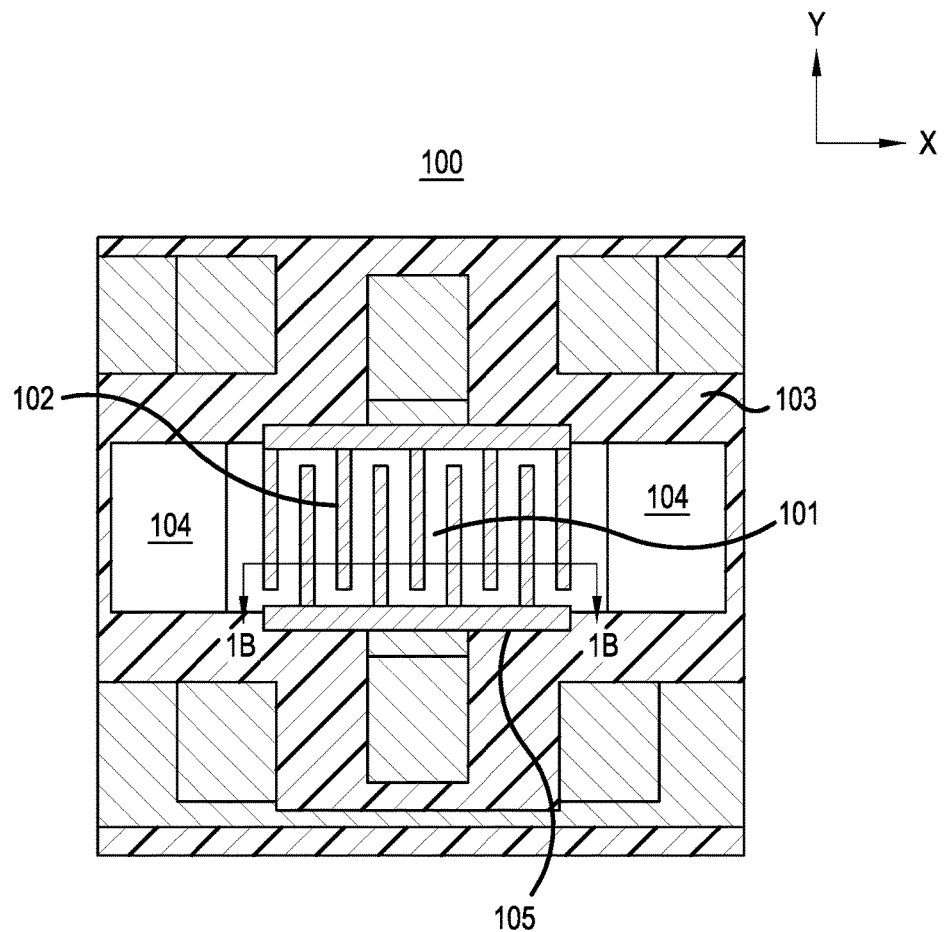
FIG. 1A is a top view of a SAW resonator device in accordance with representative embodiments.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

It is to be understood that the terminology used herein is for purposes of describing particular embodiments only, and is not intended to be limiting. Any defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices.

As used in the specification and appended claims, and in addition to their ordinary meanings, the terms 'substantial' or 'substantially' mean to with acceptable limits or degree. For example, 'substantially cancelled' means that one skilled in the art would consider the cancellation to be acceptable.

As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same.

Relative terms, such as "above," "below," "top," "bottom," "upper" and "lower" may be used to describe the various elements' relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be "below" that element. Similarly, if the device were rotated by 90° with respect to the view in the drawings, an element described "above" or "below" another element would now be "adjacent" to the other element; where "adjacent" means either abutting the other element, or having one or more layers, materials, structures, etc., between the elements.

In accordance with a representative embodiment, a surface acoustic wave (SAW) resonator device comprises a substrate having a first surface and a second surface. The semiconductor substrate comprises a bulk region, and a surface region; the surface region has a high trap density, and a reduced carrier mobility, compared to the bulk region. A piezoelectric layer, having a first surface and a second surface, is disposed over the substrate. A plurality of electrodes are disposed over the first surface of the piezoelectric layer, and the plurality of electrodes are configured to generate surface acoustic waves in the piezoelectric layer. The SAW resonator device also comprises a layer disposed between the first surface of the substrate and the second surface of the piezoelectric layer.

As described more fully below, in certain embodiments, the substrate used for the SAW resonator devices of the present teachings may comprise a high-resistivity monocrystalline semiconductor material. In other embodiments, the substrate used for the SAW resonator device may comprise a polycrystalline material, an amorphous material, or an electrically insulating material.

In embodiments in which the substrate comprises a high-resistivity monocrystalline semiconductor material (e.g., monocrystalline silicon), an oxide layer may exist between the piezoelectric material of the SAW resonator device, and the substrate. The periodic crystalline structure of the high-resistivity monocrystalline semiconductor material results, of course, in the establishment of valence and conduction bands in the substrate. Energy-band bending may occur at the interface of the high-resistivity monocrystalline semiconductor substrate and the oxide layer, due to differences in the work-functions of the materials, charges deeply trapped in the oxide layer, and the surface polarization of a piezoelectric layer disposed thereover.

As such, near the substrate-oxide interface, the conduction band edge is brought close to the Fermi level, populating the surface region with carriers (electrons or holes depending on the band bending) in an inversion channel at this interface. The free carriers that populate the inversion channel are then susceptible to the electric fields generated by the electrodes of the SAW resonator device, and unwanted (spurious) RF currents are supported. These spurious currents can result in non-linear behavior of the SAW resonator device due to the formation of pn junctions in the structure, and intermodulation distortion (IMD) products, which ultimately deteriorate the performance of the SAW resonator device, and devices (e.g., filters) in which the SAW resonator device are implemented.

Notably, the piezoelectric materials used for the piezoelectric layers (e.g., lithium tantalite (LT), or lithium niobate (LN)) are ferroelectric materials. When such piezoelectric materials are provided directly on the high-resistivity monocrystalline semiconductor substrates, surface polarization can also cause the creation of an inversion channel with free carriers, and the deleterious spurious RF currents can result.

According to the present teachings, when a high-resistivity monocrystalline semiconductor substrate is used, a region (referred to as the surface region) of material is disposed between the bulk high-resistivity monocrystalline semiconductor substrate (sometimes referred to as the bulk region), and an oxide layer, or other suitable dielectrics, including, but not necessarily limited to silicon nitride (SiN), silicon carbide (SiC), LT or LN. This surface region has high trap density, and a reduced carrier mobility, compared to the high-resistivity monocrystalline semiconductor substrate (sometimes referred to as a surface region). As can be appreciated, the high trap density surface region presents a high probability of trapping (or annihilating) free charge carriers, which substantially reduces the creation of spurious RF currents due to electric fields from the electrodes of the SAW resonator device. Beneficially, therefore, undesired IMD products are reduced, and linearity of the SAW resonator devices is improved compared to known devices.

In other embodiments, described below, the creation of an inversion channel is avoided by using an amorphous, or a polycrystalline material (e.g., amorphous Si, or polycrystalline Si) as the substrate for the SAW resonator device. As described more fully below, the amorphous or polycrystalline layer may be deposited over the bulk high-resistivity substrate, or formed by roughening the upper portion of the bulk high-resistivity substrate using a known technique (e.g., mechanical grinding), or by ion implanting the Si substrate using a known technique, such as described in U.S. Pat. No. 7,728,485, the entire disclosure of which is specifically incorporated herein by reference. In still other embodiments, the substrate of the SAW resonator device may comprise an electrically insulating material, including but not necessarily limited to sapphire, glass, and alumina ceramic.

FIG. 1A is a top view of a SAW resonator device 100 according to a representative embodiment. Notably, the SAW resonator device 100 is intended to be merely illustrative of the type of device that can benefit from the present teachings. Other types of SAW resonators, including, but not limited to a dual mode SAW (DMS) resonators, and structures therefore, are contemplated by the present teachings. The SAW resonator device 100 of the present teachings is contemplated for a variety of applications. By way of example, and as described in connection with FIG. 5, a plurality of SAW resonator devices 100 can be connected in a series/shunt arrangement to provide a ladder filter.

The SAW resonator device 100 comprises a piezoelectric layer 103 disposed over a substrate (not shown in FIG. 1A). In accordance with representative embodiments, the piezoelectric layer 103 comprises one of lithium niobate ($LiNbO_3$), which is commonly abbreviated LN; or lithium tantalate ($LiTaO_3$), which is commonly abbreviated LT.

The SAW resonator device 100 comprises an active region 101, which comprises a plurality of interdigitated electrodes 102 disposed over a piezoelectric layer 103, with acoustic reflectors 104 situated on either end of the active region 101. In the presently described representative embodiment, electrical connections are made to the SAW resonator device 100 using the busbar structures 105.

As is known, the pitch of the resonator electrodes determines the resonance conditions, and therefore the operating frequency of the SAW resonator device 100. Specifically, the interdigitated electrodes are arranged with a certain pitch between them, and a surface wave is excited most strongly when its wavelength is the same as the pitch of the electrodes. The equation $f_1=v/\lambda$ describes the relation between the resonance frequency ($f_0$), which is generally the operating frequency of the SAW resonator device 100, and the propagation velocity (v) of a surface wave. These SAW waves comprise Rayleigh or Leaky waves, as is known to one of ordinary skill in the art, and form the basis of function of the SAW resonator device 100.

Figure 1B:
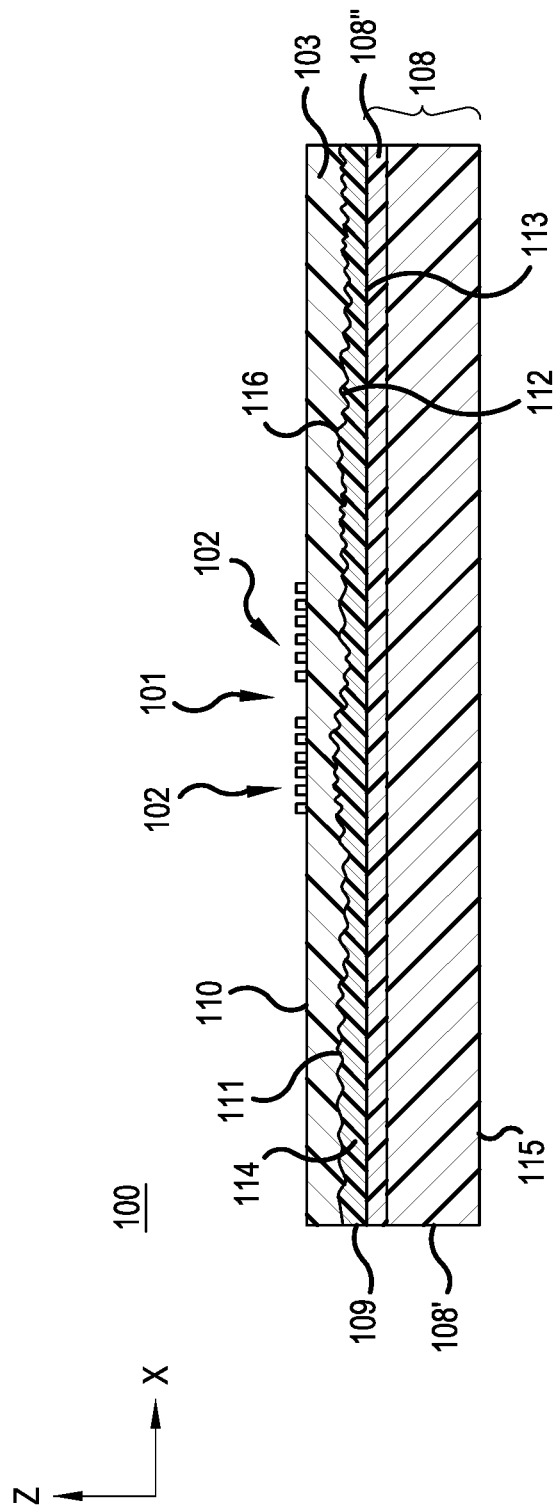
FIG. 1B is the cross-sectional view of a SAW resonator device of FIG. 1A along line 1B-1B.

Generally, there is a desired fundamental mode, which is typically a Leaky mode, for the SAW resonator device 100. By way of example, if the piezoelectric layer 103 is a 42° rotated LT, the shear horizontal mode, having a displacement in the plane of the interdigitated electrodes 102 (the x-y plane of the coordinate system of FIG. 1A). The displacement of this fundamental mode is substantially restricted to near the upper surface (first surface 110 as depicted in FIG. 1B) of the piezoelectric layer 103. It is emphasized that the 42° rotated LT piezoelectric layer 103, and the shear horizontal mode are merely illustrative of the piezoelectric layer 103 and desired fundamental mode, and other materials and desired fundamental modes are contemplated.

FIG. 1B is a cross-sectional view of the SAW resonator device 100 depicted in FIG. 1A along the lines 1B-1B. The SAW resonator device 100 comprises a substrate 108 disposed beneath the piezoelectric layer 103, and a layer 109 disposed between the substrate 108 and the piezoelectric layer 103.

The SAW resonator device 100 comprises a substrate 108 disposed beneath the piezoelectric layer 103, and a layer 109 disposed between the substrate 108 and the piezoelectric layer 103.

As noted above, the piezoelectric layer 103 illustratively comprises one of LN or LT. Generally, in the representative embodiments described below, the piezoelectric layer 103 is a wafer that is previously fabricated, and that is adhered to the layer 109 by atomic bonding as described more fully below.

The materials selected for the piezoelectric layer 103 can be divided into two types: one which has been used for a long time and with a high degree of freedom in design is used for Rayleigh wave substrates; the other, with less freedom and limited in design, is for Leaky wave substrates with low loss characteristics and easily reaches the higher frequencies by high acoustic velocity, and are mainly used for mobile communications. LN and LT materials are often used for broadband filters, and according to the filter specifications, the manufacturing materials and cutting angles differ. Filters for applications that require comparatively low loss mainly generally require Leaky wave materials, while Rayleigh wave materials are predominately used for communication equipment that requires low ripple and low group delay characteristics. Among Rayleigh wave materials, ST-cut crystal has the best temperature characteristics as a piezoelectric material.

In accordance with a representative embodiment, the substrate 108 comprises a bulk region 108', and a surface region 108". As described more fully below, the bulk region comprises a high-resistivity monocrystalline semiconductor material, and the surface region 108" has a high trap density and a reduced carrier mobility compared to the bulk region 108'.

In accordance with a representative embodiment, the bulk region 108' comprises monocrystalline silicon, and has a thickness of approximately 50.0 μm to approximately 800.0 μm. In certain representative embodiments, in order to improve the performance of a filter comprising SAW resonator device(s) 100, the substrate 108 may comprise a comparatively high-resistivity material. Illustratively, the substrate 108 may comprise single crystal silicon that is doped to a comparatively high resistivity. Notably, other high-resistivity, monocrystalline materials besides silicon are contemplated for use as the substrate 108 of the SAW resonator device 100. By way of example, other single-crystal semiconductor materials can be used for the substrate 108. Moreover, other single-crystal materials, such as single-crystal aluminum oxide ($Al_2O_3$) (sometimes referred to as "sapphire") could be used as well.

The surface region 108" comprises a material, which, compared to the bulk region 108', has an increased bandgap, very high trap density (high probability of trapping free charge carriers), and a reduced carrier mobility.

The thickness of this surface region 108" should be at least as great as the depth of an inversion layer that would form if the surface region 108" were made up of a monocrystalline material (e.g., silicon). Since the thickness of the inversion layer depends, among other things, on the semiconductor material and its doping, the thickness of the surface region 108" is typically in range from a few nanometers (nm) up to several hundreds of micrometers (μm).

As noted above, the bulk region 108' may comprise single-crystal silicon. In such an embodiment, the surface region may comprise amorphous silicon (aSi) or polycrystalline silicon. Notably, however, since a single grain of a polysilicon material is monocrystalline, the grain size of the polycrystalline silicon here should be much smaller compared to a typical resonator device size and the thickness of the surface region 108". In accordance with a representative embodiment, an average grain size is more than 10 times smaller than a thickness of the surface region 108".

The surface region 108" can be formed by one of a number of known methods. For example, an amorphous silicon layer can be deposited by a known method over the bulk region 108' to form the substrate 108. Similarly, a polysilicon layer may be deposited by a known method over the bulk region 108' to form the substrate 108. Notably, of course, the grain size of the polysilicon structure that comprises the surface region 108" in such an embodiment should be much smaller than the structure sizes/area of the resonator. Moreover, known ion implantation methods may be used to dope or amorphize the monocrystalline structure of the substrate 108, thereby creating the surface region 108" over the bulk region 108'.

As noted above, other semiconductor materials (not silicon) can be used as the substrate 108. By similar methods the surface region 108" can be provided over the bulk region 108' by depositing or forming a deteriorated lattice structure by similar techniques to those used for silicon. As such, by adding a layer of amorphous or polycrystalline material over the bulk region 108', or by deteriorating the lattice structure of a given substrate material provides a surface region 108" comprising an increased bandgap, very high trap density and an at least 100 times reduced carrier mobility, compared to the bandgap, trap density and carrier mobility of the bulk region 108'.

Among other benefits, the use of substrates having the surface regions (e.g., surface region 108") according to the present teachings avoids the generation of a surface channel at the surface of the semiconductor, which otherwise (for a conventional substrate) is formed by an inversion layer. Such a surface channel results in a lossy surface current between resonators and/or interconnections of different potential. As a consequence, SAW resonator devices of the present teachings will provide a comparatively lower loss, which means that the SAW filters comprise an improved insertion loss, or the SAW resonators comprise an improved quality factor (Q).

The piezoelectric layer 103 has a first surface 110, and a second surface 111, which opposes the first surface 110. The second surface 111 has a plurality of features 116 thereacross. As noted in above-incorporated U.S. patent application Ser. No. 14/866,394, the plurality of features 116 may remain on the unprocessed piezoelectric layer, or may be formed on the piezoelectric layer 103 using a known roughening method.

As noted above, undesired spurious modes are launched in the piezoelectric layer 103, and propagate down to the second surface 111. As described more fully in above-incorporated U.S. patent application Ser. No. 14/866,394, the plurality of features 116 reflect undesired spurious modes at various angles and over various distances to destructively interfere with the undesired spurious waves in the piezoelectric layer 103, and possibly enable a portion of these waves to be beneficially converted into desired SAW waves. Again as described more fully below, the reflections provided by the plurality of features 116 foster a reduction in the degree of spurious modes (i.e., standing waves), which are created by the reflection of acoustic waves at the interface of the second surface 111 of the piezoelectric layer 103 and the first surface 112 of layer 109. Ultimately, the reflections provided by the plurality of features 116 serve to improve the performance of devices (e.g., filters) that comprise a plurality of SAW resonator devices 100.

As described in above-incorporated U.S. patent application Ser. No. 14/866,394, there are multiple spurious modes, each having a different frequency and wavelength. In accordance with a representative embodiment, the height of the features 116 of the substrate 108 is approximately $0.2\lambda$ to $10.0\lambda$, where $\lambda$ is the wavelength of one or more of the spurious modes. Selecting the height of the features to be approximately $0.2\lambda$ to $10.0\lambda$ of a particular spurious mode alters the phase of the reflected waves, and results in destructive interference by the reflected waves, and substantially prevents the establishment of standing waves, and thus spurious modes.

In some embodiments, the height of the features 116 is substantially the same, and, again, the height is selected to be in the range of approximately $0.2\lambda$ to $10\lambda$ where $\lambda$ is the wavelength of one (e.g., a predominant) of the spurious modes. In other embodiments, the height of the features 116 is not the same, but rather each feature has a different height that is selected to be in the range of approximately $0.2\lambda$ to approximately $10\lambda$ of one of the multiple spurious modes. By selecting one height or multiple heights, the phase of the reflected waves is altered, and results in destructive interference by the reflected waves, thereby substantially preventing the establishment of standing waves of multiple frequencies, thus preventing the establishment of multiple spurious modes.

By way of example, if the spurious modes have a frequency of 700 MHz, the wavelength $\lambda$ is approximately 6.0 μm. As such, the height of the features 116 would be in the range of approximately 1.2 μm to approximately 60 μm. By contrast, if the spurious modes have a frequency of 4200 MHz, then $\lambda$ is approximately 1.0 μm. In this example, the height of the features 116 would be approximately 0.20 μm. More generally, the height of the features is in the range of less than approximately 0.2 μm (e.g., 0.1 μm) to greater than approximately 1.5 μm (e.g., 10.0 μm). As will be appreciated, the range for the height depends on the frequency of the fundamental mode.

The non-periodic orientation of the plurality of features 116, the generally, angled surfaces provided by the plurality of features 116, and providing the height of the features 116 to be in the noted range relative to the wavelength of the propagating spurious modes combine to alter the phase of the acoustic waves incident on the various features. Beneficially, these factors in combination result in comparatively diffuse reflection of the acoustic wave back into the piezoelectric layer 103. This comparatively diffuse reflection of the acoustic waves from the features 116 will generally not foster constructive interference, and the establishment of resonance conditions. Accordingly, the plurality of features 116 generally prevent the above-noted parasitic acoustic standing waves (i.e., spurious modes) from being established from the acoustic waves generated in the piezoelectric layer 103, which travel down and into the substrate 108.

One measure of the impact of the parasitic spurious modes on the performance of a device (e.g., filter) comprising a SAW resonator is the quality (Q) factor. For example, the parasitic spurious modes couple at the interfaces of the piezoelectric layer 103 and remove energy available for the desired SAW modes and thereby reduce the Q-factor of the resonator device. As is known, the Q-circle of a Smith Chart has a value of unity along its circumferences. The degree of energy loss (and therefore reduction in Q) is depicted with the reduction of the $S_{11}$ parameter of the unit circle. Notably, as a result of parasitic spurious modes and other acoustic losses, sharp reductions in Q of known devices can be observed on a so-called Q-circle of a Smith Chart of the $S_{11}$ parameter. These sharp reductions in Q-factor are known as "rattles," and are strongest in the southeast quadrant of the Q-circle. Or, for frequencies above the anti-resonant frequency, fp. These spurious modes occur at discrete frequencies over a range of frequencies above the mechanical or fundamental frequency. While not too problematic in single band filtering, these modes can be particularly problematic in applications of aggregation of multiple bands to be used simultaneously, carrier aggregation, is used. In such applications, if one filter has spurious modes outside its own band, they are likely to exist in the bands of another filter. This is unacceptable for normal carrier aggregation. Beneficially, because of the diffuse reflections of the present teachings, and attendant phase mismatch of the reflected acoustic waves realized by the plurality of features 116, compared to such known devices, a filter comprising SAW resonator devices of representative embodiments of the present teachings, show lesser magnitudes of the "rattles", and a somewhat "spreading" of the reduced "rattles" is experienced.

The layer 109 is illustratively an oxide material, such as silicon dioxide ($SiO_2$), or phosphosilicate glass (PSG), borosilicate glass (BSG), a thermally grown oxide, or other material amenable to polishing to a high degree of smoothness, as described more fully below. The layer 109 is deposited by a known method, such as chemical vapor deposition (CVD) or plasma enhanced chemical vapor deposition (PECVD), or may be thermally grown. In accordance with representative embodiments, the layer 109 is polished to a thickness in the range of approximately 0.05 μm to approximately 6.0 μm. Notably, the layer 109 may be polished to a thickness greater than the minimum to maximum thickness variation of the roughened second surface 111 of the piezoelectric layer 103.

Layer 109 has a first surface 112 and a second surface 113. As described more fully in above-incorporated U.S. patent application Ser. No. 14/866,394, the second surface 113 of layer 109 is polished, such as by chemical-mechanical polishing in order to obtain a "mirror" like finish with a comparatively low root-mean-square (RMS) variation of height. This low RMS variation of height significantly improves the contact area between the second surface 113 of the layer 109 and the first surface 114 of the substrate 108 to improve the atomic bonding between the first surface 114 and the second surface 113. As is known, the bond strength realized by atomic bonding is directly proportional to the contact area between two surfaces. As such, improving the flatness/smoothness of the second surface 113 fosters an increase in the contact area, thereby improving the bond of the layer 109 to the substrate 108. As used herein, the term atomically smooth means sufficiently smooth to provide sufficient contact area to provide a sufficiently strong bond strength between the layer 109 and the substrate 108, at the interface of their second and first surfaces 113, 114, respectively.

The substrate 108 has a first surface 114 and a second surface 115 opposing the first surface 114. As depicted in FIG. 1B, the first surface 114 is a surface of the surface region 108". As noted above, the surface region 108" comprises an amorphous or polycrystalline material, which often comprises the same material as the bulk region 108' (e.g., silicon). In order to foster suitable bonding of the first surface 114 of the substrate 108 to second surface 113 of the layer 109, the substrate 108 undergoes a chemical-mechanical-polish (CMP) sequence. As such, the surface region 108" is first formed by deposition, ion implantation, or roughening, as noted above, and thereafter, the CMP sequence can be performed to obtain a "mirror" like finish with a comparatively low RMS variation of height over first surface 114.

Figure 2:
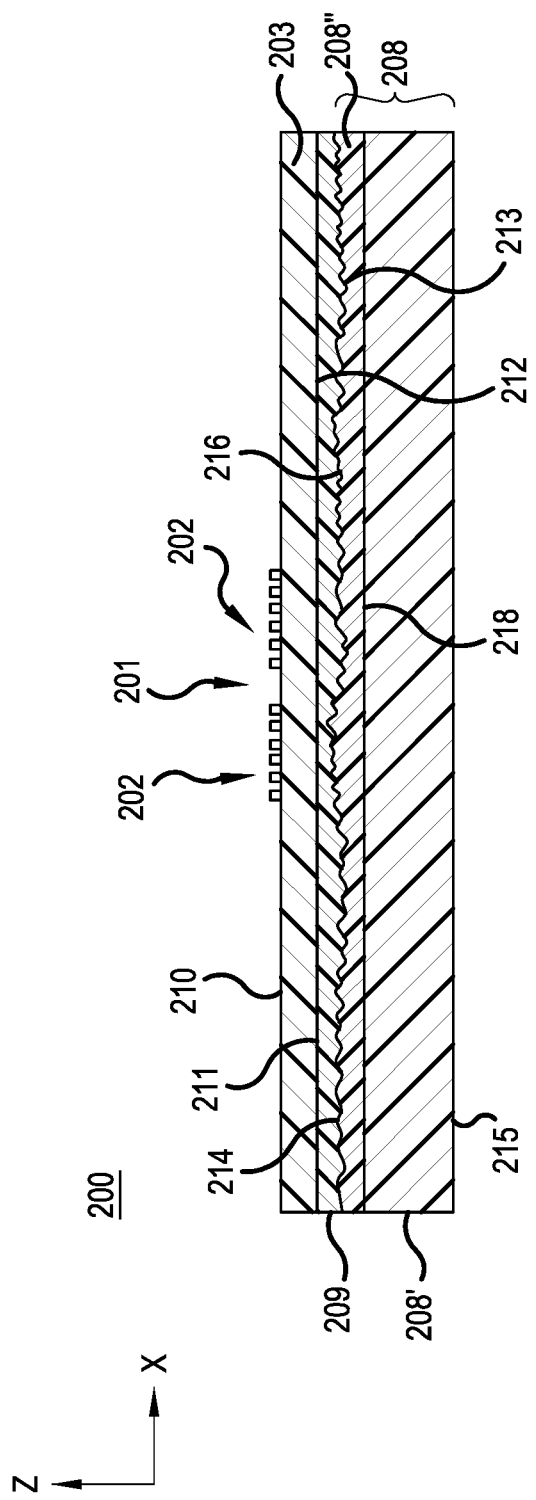
FIG. 2 is a cross-sectional view of a portion of the SAW resonator device in accordance with a representative embodiment.

FIG. 2 is a cross-sectional view of the SAW resonator device 200 depicted in FIG. 1A along the lines 1B-1B. Many aspects and details of SAW resonator device 200 are common to those described above in connection with FIGS. 1A-1B. These common aspects and details may not be repeated to avoid obscuring the description of the present representative embodiment.

The SAW resonator device 200 comprises a substrate 208 disposed beneath the piezoelectric layer 203, and a layer 209 disposed between the substrate 208 and the piezoelectric layer 203.

As noted above, the piezoelectric layer 203 illustratively comprises one of LN or LT. Generally, in the representative embodiments described below, the piezoelectric layer 203 is a wafer that is previously fabricated, and that is adhered to the layer 209 by atomic bonding as described more fully below.

The materials selected for the piezoelectric layer 203 can be divided into two types: one which has been used for a long time and with a high degree of freedom in design is used for Rayleigh wave substrates; the other, with less freedom and limited in design, is for Leaky wave substrates with low loss characteristics and easily reaches the higher frequencies by high acoustic velocity, and are mainly used for mobile communications. LN and LT materials are often used for broadband filters, and according to the filter specifications the manufacturing materials and cutting angles differ. Filters for applications that require comparatively low loss mainly generally require Leaky wave materials, while Rayleigh wave materials are predominately used for communication equipment that requires low ripple and low group delay characteristics. Among Rayleigh wave materials, ST-cut crystal has the best temperature characteristics as a piezoelectric material.

In accordance with a representative embodiment, the substrate 208 comprises a bulk region 208', and a surface region 208". As described more fully below, the bulk region comprises a high-resistivity monocrystalline semiconductor material, and the surface region 208" has a high trap density and a reduced carrier mobility compared to the bulk region 208'.

In accordance with a representative embodiment, the bulk region 208' comprises monocrystalline silicon, and has a thickness of approximately 50.0 µm to approximately 800.0 µm. In certain representative embodiments, in order to improve the performance of a filter comprising SAW resonator device(s) 200, the substrate 208 may comprise a comparatively high-resistivity material. Illustratively, the substrate 208 may comprise single-crystal silicon that is doped to a comparatively high resistivity. Notably, other high-resistivity, monocrystalline materials besides silicon are contemplated for use as the substrate 208 of the SAW resonator device 200. By way of example, other single-crystal semiconductor materials can be used for the substrate 208. Moreover, other single-crystal materials, such as single-crystal aluminum oxide ($Al_2O_3$) (sometimes referred to as "sapphire") could be used as well.

The surface region 208" comprises a material, which, compared to the bulk region 208', has an increased bandgap, very high trap density (high probability of trapping free charge carriers), and a reduced carrier mobility.

The thickness of this (nonmonocrystalline) surface region 208" should be at least as great as the depth of an inversion layer that would form if the surface region 208" were made up of a monocrystalline material (e.g., silicon). Since the thickness of the inversion layer depends, among other things, on the semiconductor material and its doping, the thickness of the surface region 208" is typically in range from a few nanometers (nm) up to several hundreds of micrometers (µm).

As noted above, the bulk region 208' may comprise single-crystal silicon. In such an embodiment, the surface region may comprise amorphous silicon (aSi), or polycrystalline silicon. Notably, however, since a single grain of a polysilicon material is monocrystalline, the grain size of the polycrystalline silicon here should be much smaller compared to a typical resonator device size and the thickness of the surface region 208". Again, in accordance with a representative embodiment, an average grain size of more than 10 times smaller than a thickness of the surface region is beneficial.

The surface region 208" can be formed by one of a number of known methods. For example, an amorphous silicon layer can be deposited by a known method over the bulk region 208' to form the substrate 208. Similarly, a polysilicon layer may be deposited by a known method over the bulk region 208' to form the substrate 208. Notably, of course, the grain size of the polysilicon structure that comprises the surface region 208" in such an embodiment should be much smaller than the structure sizes/area of the resonator. Moreover, known ion implantation methods may be used to dope or amorphize the monocrystalline structure of the substrate 208, thereby creating the surface region 208" over the bulk region 208'.

As noted above, other semiconductor materials (not silicon) can be used as the substrate 208. By similar methods the surface region 208" can be provided over the bulk region 208' by depositing or forming a deteriorated lattice structure by similar techniques to those used for silicon. As such, adding a layer of amorphous or polycrystalline material over the bulk region 208', or deteriorating the lattice structure of a given substrate material provides a surface region 208" comprising an increased bandgap, very high trap density and an at least 100 times reduced carrier mobility, compared to the bandgap, trap density and a carrier mobility of the bulk region 208'.

As noted above, a benefit of the certain representative embodiments is that the use of such a substrate avoids the generation of a surface channel at the surface of the semiconductor, which otherwise (for a conventional substrate) is formed by an inversion layer. Such a surface channel results in a lossy surface current between resonators and/or interconnections of different potential. As a consequence, SAW resonator devices of the present teachings will provide a comparatively lower loss, which means that the SAW filters comprise an improved insertion loss, or the SAW resonators comprise an improved quality factor (Q).

The layer 209 is illustratively an oxide material, such as $SiO_2$, or phosphosilicate glass (PSG), borosilicate glass (BSG), a thermally grown oxide, or other material amenable to polishing to a high degree of smoothness, as described more fully below. The layer 209 is deposited by a known method, such as chemical vapor deposition (CVD) or plasma enhanced chemical vapor deposition (PECVD), or may be thermally grown. As described more fully below, the layer 209 is polished to a thickness in the range of approximately 0.05 µm to approximately 6.0 µm.

The piezoelectric layer 203 has a first surface 210, and a second surface 211, which opposes the first surface 210. Similarly, the layer 209 has a first surface 212 and a second surface 213. As depicted in FIG. 2, the first surface 212 of the layer 209 is atomically bonded to the second surface 211 of the piezoelectric layer 203, as described more fully The substrate 208 has a first surface 214 and a second surface 215 opposing the first surface 214. The first surface 214 has a plurality of features 216 there-across. Undesired spurious modes are launched in the piezoelectric layer 203, and propagate down to the first surface 214. As described more fully in above-incorporated U.S. patent application Ser. No. 14/835,679, the plurality of features 216 reflect undesired spurious modes at various angles and over various distances to destructively interfere with the undesired spurious waves in the piezoelectric layer 203, and possibly enable a portion of these waves to be beneficially converted into desired SAW waves. The reflections provided by the plurality of features 216 foster a reduction in the degree of spurious modes (i.e., standing waves), which are created by the reflection of acoustic waves at the interface of the second surface 211 of the piezoelectric layer 203 and the first surface 212 of layer 209. Ultimately, the reflections provided by the plurality of features 216 serve to improve the performance of devices (e.g., filters) that comprise a plurality of SAW resonator devices 200.

As described in above-incorporated U.S. patent application Ser. No. 14/835,679, the first surface 212 of layer 209 is polished, such as by chemical-mechanical polishing in order to obtain a "mirror" like finish with a comparatively low RMS variation of height. This low RMS variation of height significantly improves the contact area between the first surface 212 of the layer 209 and the second surface 211 of the piezoelectric layer 203 to improve the atomic bonding between the first surface 212 of layer 209 and the second surface 211 of the piezoelectric layer 203. As is known, the bond strength realized by atomic bonding is directly proportional to the contact area between two surfaces. As such, improving the flatness/smoothness of the first surface 212 fosters an increase in the contact area, thereby improving the bond of the layer 209 to the piezoelectric layer 203. As used herein, the term atomically smooth means sufficiently smooth to provide sufficient contact area to provide a sufficiently strong bond strength between the layer 209 and the piezoelectric layer 203, at the interface of their first and second surfaces 212, 211, respectively.

As described more fully in above-incorporated U.S. patent application Ser. No. 14/835,679, the shape, dimensions and spacing of the features 216 depends on their method of fabrication. As will be appreciated by one of ordinary skill in the art, the method of fabricating the features 216 will depend when the surface region 208" is formed. By way of example, if the features 216 are formed before the surface region 208" is formed, the substrate 208, at this point, may be monocrystalline material (e.g., moncrystalline Si). In this case, the features 216 may be formed by selective etching, such as described in above-incorporated U.S. patent application Ser. No. 14/835,679, or other methods described therein. However, if the surface region 208" is formed before the features 216 are formed (e.g., by ion implantation, deposition of an amorphous material or a polycrystalline material, or mechanical grinding), the features 216 cannot be formed by selective etching, and are thus formed by other known techniques, such as mechanical roughening methods. Still alternatively, the features 216 may be formed prior to the formation of the surface region 208". As such, the features 216 may be formed by a selective etch, or other mechanical roughening methods, and the amorphous or polysilicon material may be deposited over the features.

As noted in above-incorporated U.S. patent application Ser. No. 14/835,679, using a known etching technique, the plurality of features 216 are formed in the substrate 208, and may have a generally pyramidal shape. Notably, some of the plurality of features 216 may have comparatively "flat" tops. The features 216 also have a height that may be substantially the same across the width of the interface between the substrate 208 and the layer 209. Moreover, the width (x-dimension in the coordinate system of FIG. 2) of the features 216 may be the same, or may be different. Generally, however, the width of the features is on the order of the desired fundamental mode of the SAW resonator device 200. Alternatively, and again depending on the method of fabrication, the height of the features 216 may not be the same. Rather, by selecting the height of the features to be different, a reduction in the incidence of more than one of the spurious modes can be realized, further improving the performance of the SAW resonator device 200.

Figure 3:
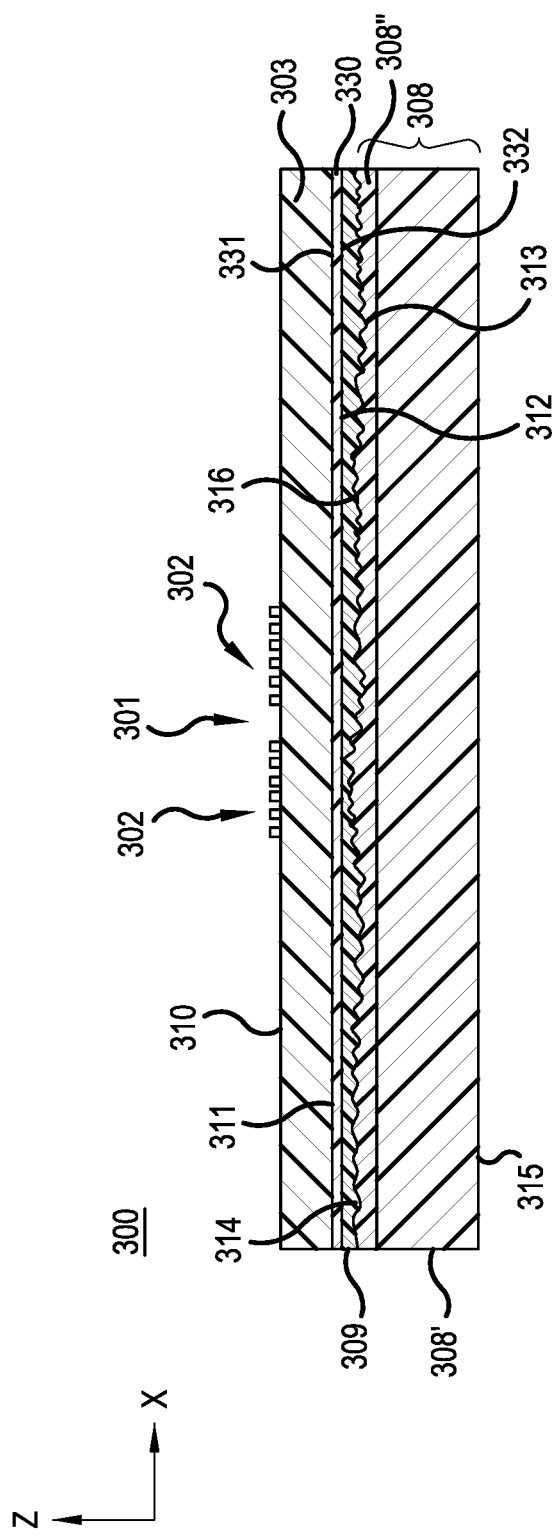
FIG. 3 is a cross-sectional view of a portion of a SAW resonator device in accordance with a representative embodiment.

FIG. 3 is a cross-sectional view of the SAW resonator device 300 in accordance with a representative embodiment. Many aspects and details of SAW resonator device 300 are common to those described above in connection with FIGS. 1A-2. These common aspects and details may not be repeated to avoid obscuring the description of the present representative embodiment.

The SAW resonator device 300 comprises a substrate 308 disposed beneath the piezoelectric layer 303, a layer 309 is disposed over the substrate 308, and a silicon layer 330 is disposed between the layer 309 and the piezoelectric layer 303.

As noted above, the piezoelectric layer 303 illustratively comprises one of LN or LT. Generally, in the representative embodiments described below, the piezoelectric layer 303 is a wafer that is previously fabricated, and that is adhered to the layer 309 by atomic bonding as described more fully below.

The materials selected for the piezoelectric layer 303 can be divided into two types: one which has been used for a long time and with a high degree of freedom in design is used for Rayleigh wave substrates; the other, with less freedom and limited in design, is for Leaky wave substrates with low loss characteristics and easily reaches the higher frequencies by high acoustic velocity, and are mainly used for mobile communications. LN and LT materials are often used for broadband filters, and according to the filter specifications the manufacturing materials and cutting angles differ. Filters for applications that require comparatively low loss mainly generally require Leaky wave materials, while Rayleigh wave materials are predominately used for communication equipment that requires low ripple and low group delay characteristics. Among Rayleigh wave materials, ST-cut crystal has the best temperature characteristics as a piezoelectric material.

In accordance with a representative embodiment, the substrate 308 comprises a bulk region 308', and a surface region 308". As described more fully below, the bulk region comprises a high-resistivity monocrystalline semiconductor material, and the surface region 308" has a high trap density and a reduced carrier mobility compared to the bulk region 308'.

In accordance with a representative embodiment, the bulk region 308' comprises monocrystalline silicon, and has thickness of approximately 50.0 µm to approximately 800.0 µm. In certain representative embodiments, in order to improve the performance of a filter comprising SAW resonator device(s) 300, the substrate 308 may comprise a comparatively high-resistivity material. Illustratively, the substrate 308 may comprise single-crystal silicon that is doped to a comparatively high resistivity. Notably, other high-resistivity, monocrystalline materials besides silicon are contemplated for use as the substrate 308 of the SAW resonator device 300. By way of example, other single-crystal semiconductor materials can be used for the substrate 308. Moreover, other single-crystal materials, such as single crystal aluminum oxide ($Al_2O_3$) (sometimes referred to as "sapphire") could be used as well.

The surface region 308" comprises a material, which, compared to the bulk region 308', has an increased bandgap, very high trap density (high probability of trapping free charge carriers), and a reduced carrier mobility.

The thickness of this (nonmonocrystalline) surface region 308" should be at least as great as the depth of an inversion layer that would form if the surface region 308" were made up of a monocrystalline material (e.g., silicon). Since the thickness of the inversion layer depends, among other things, on the semiconductor material and its doping, the thickness of the surface region 308" is typically in range from a few nanometers (nm) up to several hundreds of micrometers (µm).

As noted above, the bulk region 308' may comprise single-crystal silicon. In such an embodiment, the surface region may comprise, amorphous silicon (aSi), or polycrystalline silicon. Notably, however, since a single grain of a polysilicon material is monocrystalline, the grain size of the polycrystalline silicon here should be much smaller compared to a typical resonator device size and the thickness of the surface region 308". As noted above, an average grain size is illustratively more than 10 times smaller than a thickness of the surface region The surface region 308" can be formed by one of a number of known methods. For example, an amorphous silicon layer can be deposited by a known method over the bulk region 308' to form the substrate 308. Similarly, a polysilicon layer may be deposited by a known method over the bulk region 308' to form the substrate 308. Notably, of course, the grain size of the polysilicon structure that comprises the surface region 308" in such an embodiment should be much smaller than the structure sizes/area of the resonator. Moreover, known ion implantation methods may be used to dope or amorphize the monocrystalline structure of the substrate 308, thereby creating the surface region 308" over the bulk region 308'.

As noted above, other semiconductor materials (not silicon) can be used as the substrate 308. By similar methods, the surface region 308" can be provided over the bulk region 308' by depositing or forming a deteriorated lattice structure by similar techniques to those used for silicon. As such, by adding a layer of amorphous or polycrystalline material to over the bulk region 308', or by deteriorating the lattice structure of a given substrate material provides a surface region 308" comprising an increased bandgap, very high trap density and an at least 100 times reduced carrier mobility, compared to the bandgap, trap density and a carrier mobility of the bulk region 308'.

As noted above, a benefit of the certain representative embodiments is that the use of such a substrate avoids the generation of a surface channel at the surface of the semiconductor, which otherwise (for a conventional substrate) is formed by an inversion layer. Such a surface channel results in a lossy surface current between resonators and/or interconnections of different potential. As a consequence, SAW resonator devices of the present teachings will provide a comparatively lower loss, which means that the SAW filters comprise an improved insertion loss, or the SAW resonators comprise an improved quality factor (Q).

The layer 309 is illustratively an oxide material, such as $SiO_2$, or phosphosilicate glass (PSG), borosilicate glass (BSG), a thermally grown oxide, or other material amenable to polishing to a high degree of smoothness, as described more fully below. The layer 309 is deposited by a known method, such as chemical vapor deposition (CVD) or plasma enhanced chemical vapor deposition (PECVD), or may be thermally grown. As described more fully below, the layer 309 is polished to a thickness in the range of approximately 0.05 µm to approximately 6.0 µm.

The silicon layer 330 is illustratively polycrystalline silicon (poly-Si) and is deposited using a known method, such as plasma-enhanced chemical vapor deposition (PECVD) or similar method. After deposition is complete, a cleaning step, such as a known sputtering step, is carried out to remove any oxide or debris from the first surface 331 of the silicon layer 330. This cleaning step fosters bonding of the first surface to the piezoelectric layer 303. This bonding provides good adhesion between the silicon layer 330 and the piezoelectric layer 303.

Illustratively, the silicon layer 330 has a thickness in range of approximately 100 Å to approximately one-third of the wavelength ($\lambda/3$) of a SAW wave, where the wavelength is defined by the pitch of the interdigitated electrodes 302 (IDT) and the velocity of sound in the medium ($L=v_a/2*pitch$). Generally, the thickness of the silicon layer 330 is selected to be thick enough so that it is atomically smooth and continuous, and not too thick that the desired scattering of spurious modes from the features 316 does not occur. To this end, if the silicon layer 330 is too thin, unevenness across the thickness can result in relative peaks and valleys across the first surface 331 and incomplete coverage of the underlying layer. These peaks and valleys deleteriously reduce the area of contact between the first surface 331 and the second surface 311 of the piezoelectric layer 303. By contrast, if the silicon layer 330 is too thick, the silicon layer 330 is like a substrate without features 316, allowing undesired spurious modes to propagate without incoherent reflection as is realized by the structure of the present teachings.

The piezoelectric layer 303 has a first surface 310, and a second surface 311, which opposes the first surface 310. The layer 309 has a first surface 312 and a second surface 313, and the silicon layer 330 has a first surface 331 and a second surface 332. As depicted in FIG. 3, the first surface 331 of the silicon layer 330 is atomically bonded to the second surface 311 of the piezoelectric layer 303, as described more fully below.

The substrate 308 has a first surface 314 and a second surface 315 opposing the first surface 314. The first surface 314 has a plurality of features 316 there-across. As noted above, undesired spurious modes are launched in the piezoelectric layer 303, and propagate down to the first surface 314. As described more fully in above-incorporated U.S. patent application Ser. No. 15/009,801, the plurality of features 316 reflect undesired spurious modes at various angles and over various distances to destructively interfere with the undesired spurious waves in the piezoelectric layer 303, and possibly enable a portion of these waves to be beneficially converted into desired SAW waves. Again as described more fully below, the reflections provided by the plurality of features 316 foster a reduction in the degree of spurious modes (i.e., standing waves), which are created by the reflection of acoustic waves at the interface of the second surface 311 of the piezoelectric layer 303 and the first surface 312 of layer 309. Ultimately, the reflections provided by the plurality of features 316 serve to improve the performance of devices (e.g., filters) that comprise a plurality of SAW resonator devices 300.

As described in above-incorporated U.S. patent application Ser. No. 15/009,801, there are multiple spurious modes, each having a different frequency and wavelength. In accordance with a representative embodiment, the height of the features 316 of the substrate 308 is approximately $0.2\lambda$ to $10.0\lambda$ where $\lambda$ is the wavelength of one or more of the spurious modes. Selecting the height of the features to be approximately $0.2\lambda$ to $10.0\lambda$ of a particular spurious mode alters the phase of the reflected waves, and results in destructive interference by the reflected waves, and substantially prevents the establishment of standing waves, and thus spurious modes.

In some embodiments, the height of the features 316 is substantially the same, and the height is selected to be in the range of approximately $0.2\lambda$ to $10\lambda$ where $\lambda$ is the wavelength of one (e.g., a predominant) of the spurious modes. In other embodiments, the height of the features 316 is not the same, but rather each feature has a different height that is selected to be in the range of approximately $0.2\lambda$ to approximately $10\lambda$ of one of the multiple spurious modes. By selecting one height or multiple heights, the phase of the reflected waves is altered, and results in destructive interference by the reflected waves, thereby substantially preventing the establishment of standing waves of multiple frequencies, thus preventing the establishment of multiple spurious modes.

As described more fully in above-incorporated U.S. patent application Ser. No. 15/009,801, in accordance with a representative embodiment, the first (upper) surface 331 of silicon layer 330 is polished, such as by chemical-mechanical polishing in order to obtain a "mirror" like finish with a comparatively low root-mean-square (RMS) variation of height. This low RMS variation of height significantly improves the contact area between the first surface 331 of the silicon layer 330 and the second surface 311 of the piezoelectric layer 303. Accordingly, providing a low RMS variation in height improves the atomic bonding between the first surface 331 and the second surface 311. As is known, the bond strength realized by atomic bonding is directly proportional to the contact area between two surfaces. As such, improving the flatness/smoothness of the first surface 331 fosters an increase in the contact area, thereby improving the bond of the silicon layer 330 to the piezoelectric layer 303. As used herein, the term atomically smooth means sufficiently smooth to provide sufficient contact area to provide a sufficiently strong bond strength between the silicon layer 330 and the piezoelectric layer 303, at the interface of their first and second surfaces 331, 311, respectively.

It is noted that the polishing sequence described above to provide the desired smoothness of the first side 331 of the silicon layer 330 may be foregone if the deposition sequence used to form the silicon layer 330 results in an atomically smooth first side 331.

Figure 4:
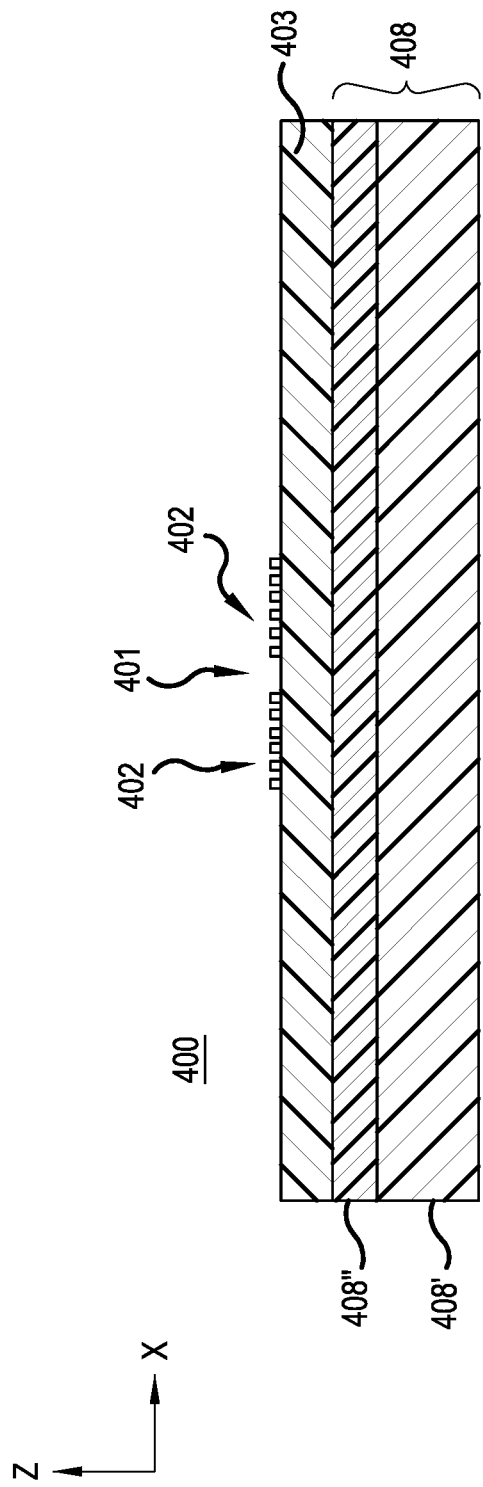
FIG. 4 is a cross-sectional view of a portion of a SAW resonator device in accordance with a representative embodiment.

FIG. 4 is a cross-sectional view of the SAW resonator device 400. Many aspects and details of SAW resonator device 400 are common to those described above in connection with FIGS. 1A-3. These common aspects and details may not be repeated to avoid obscuring the description of the present representative embodiment.

The SAW resonator device 400 comprises a substrate 408 disposed beneath the piezoelectric layer 403. As noted above, the piezoelectric layer 403 illustratively comprises one of LN or LT. Generally, in the representative embodiments described below, the piezoelectric layer 403 is a wafer that is previously fabricated, and that is adhered to the substrate 408.

The materials selected for the piezoelectric layer 403 can be divided into two types: one which has been used for a long time and with a high degree of freedom in design is used for Rayleigh wave substrates; the other, with less freedom and limited in design, is for Leaky wave substrates with low loss characteristics and easily reaches the higher frequencies by high acoustic velocity, and are mainly used for mobile communications. LN and LT materials are often used for broadband filters, and according to the filter specifications, the manufacturing materials and cutting angles differ. Filters for applications that require comparatively low loss mainly generally require Leaky wave materials, while Rayleigh wave materials are predominately used for communication equipment that requires low ripple and low group delay characteristics. Among Rayleigh wave materials, ST-cut crystal has the best temperature characteristics as a piezoelectric material.

In accordance with a representative embodiment, the substrate 408 comprises a bulk region 408', and a surface region 408". The bulk region comprises a high-resistivity monocrystalline semiconductor material, and the surface region 408" has a high trap density and a reduced carrier mobility compared to the bulk region 408'.

In accordance with a representative embodiment, the bulk region 408' comprises monocrystalline silicon, and has thickness of approximately 50.0 µm to approximately 800.0 µm. In certain representative embodiments, in order to improve the performance of a filter comprising SAW resonator device(s) 400, the substrate 408 may comprise a comparatively high-resistivity material. Illustratively, the substrate 408 may comprise single-crystal silicon that is doped to a comparatively high resistivity. Notably, other high-resistivity, monocrystalline materials besides silicon are contemplated for use as the substrate 408 of the SAW resonator device 400. By way of example, other single-crystal semiconductor materials can be used for the substrate 408. Moreover, other single-crystal materials, such as single-crystal aluminum oxide ($Al_2O_3$) (sometimes referred to as "sapphire") could be used as well.

The surface region 408" comprises a material, which, compared to the bulk region 408', has an increased bandgap, very high trap density (high probability of trapping free charge carriers), and a reduced carrier mobility.

The thickness of this (nonmonocrystalline) surface region 408" should be at least as great as the depth of an inversion layer that would form if the surface region 408" were made up of a monocrystalline material (e.g., silicon). Since the thickness of the inversion layer depends, among other things, on the semiconductor material and its doping, the thickness of the surface region 408" is typically in range from a few nanometers (nm) up to several hundreds of micrometers (µm).

As noted above, the bulk region 408' may comprise single-crystal silicon. In such an embodiment, the surface region may comprise, amorphous silicon (aSi), or polycrystalline silicon. Notably, however, since a single grain of a polysilicon material is monocrystalline, the grain size of the polycrystalline silicon here should be much smaller compared to a typical resonator device size and the thickness of the surface region 408".

The surface region 408" can be formed by one of a number of known methods. For example, an amorphous silicon layer can be deposited by a known method over the bulk region 408' to form the substrate 408. Similarly, a polysilicon layer may be deposited by a known method over the bulk region 408' to form the substrate 408. Notably, of course, the grain size of the polysilicon structure that comprises the surface region 408" in such an embodiment should be much smaller than the structure sizes/area of the resonator. Moreover, known ion implantation methods may be used to dope or amorphize the monocrystalline structure of the substrate 408, thereby creating the surface region 408" over the bulk region 408'.

As noted above, other semiconductor materials (not silicon) can be used as the substrate 408. By similar methods the surface region 408" can be provided over the bulk region 408' by depositing or forming a deteriorated lattice structure by similar techniques to those used for silicon. As such, by adding a layer of amorphous or polycrystalline material to over the bulk region 408', or by deteriorating the lattice structure of a given substrate material provides a surface region 408" comprising an increased bandgap, very high trap density and an at least 100 times reduced carrier mobility, compared to the bandgap, trap density and a carrier mobility of the bulk region 408'.

As noted above, a benefit of the certain representative embodiments is that the use of such a substrate avoids the generation of a surface channel at the surface of the semiconductor, which otherwise (for a conventional substrate) is formed by an inversion layer. Such a surface channel results in a lossy surface current between resonators and/or interconnections of different potential. In the presently described representative embodiment in which no oxide or other planarization, or atomic bonding layer is provided, the ferroelectric material used for the piezoelectric layer 403, if the surface region 408" were not provided, would cause the creation of an inversion layer near the surface of the substrate 408. As a consequence, SAW resonator device 400 of the present teachings will provide a comparatively lower loss, which means that the SAW filters comprise an improved insertion loss, or the SAW resonators comprise an improved quality factor (Q).

When connected in a selected topology, a plurality of SAW resonators can function as an electrical filter. FIG. 5 shows a simplified schematic block diagram of an electrical filter 500 in accordance with a representative embodiment. The electrical filter 500 comprises series SAW resonators 501 and shunt SAW resonators 502. The series SAW resonators 501 and shunt SAW resonators 502 may each comprise SAW resonator devices 100 (or SAW resonator devices 200, or 300, or 400) described in connection with the representative embodiments of FIGS. 1A-4. As can be appreciated, the SAW resonator devices (e.g., a plurality of SAW resonator devices 100) that comprise the electrical filter 500 may be provided over a common substrate (e.g., substrate 108), or may be a number of individual SAW resonator devices (e.g., SAW resonator devices 100) disposed over more than one substrate (e.g., more than one substrate 108). The electrical filter 500 is commonly referred to as a ladder filter, and may be used for example in duplexer applications. It is emphasized that the topology of the electrical filter 500 is merely illustrative and other topologies are contemplated. Moreover, the acoustic resonators of the representative embodiments are contemplated in a variety of applications including, but not limited to duplexers.

The various components, materials, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

The invention claimed is:

1. A surface acoustic wave (SAW) resonator device, comprising:
a semiconductor substrate having a first surface and a second surface, the semiconductor substrate comprising a bulk region and a surface region wherein the surface region has a high trap density and a reduced carrier mobility compared to the bulk region, wherein the first surface of the semiconductor substrate comprises a plurality of features;
a piezoelectric layer disposed over the semiconductor substrate, the piezoelectric layer having a first surface and a second surface;
a plurality of electrodes disposed over the first surface of the piezoelectric layer, the plurality of electrodes configured to generate surface acoustic waves in the piezoelectric layer;
a layer having a first surface and a second surface, the layer being disposed between the first surface of the semiconductor substrate and the second surface of the piezoelectric layer; and
a silicon layer having a first surface and a second surface, the silicon layer being disposed between the first surface of the layer and the second surface of the piezoelectric layer, the first surface of the silicon layer having a smoothness sufficient to foster atomic bonding between the first surface of the silicon layer and the second surface of the piezoelectric layer, wherein the plurality of features reflect acoustic waves and reduce an incidence of spurious modes in the piezoelectric layer.

2. The SAW resonator device as claimed in claim 1, wherein the layer comprises an oxide material.

3. The SAW resonator device as claimed in claim 2, wherein the oxide material comprises silicon dioxide ($SiO_2$).

4. The SAW resonator device as claimed in claim 1, wherein the surface region comprises a same material as the semiconductor substrate.

5. The SAW resonator device as claimed in claim 4, wherein the bulk region is a substantially monocrystalline semiconductor, and the surface region is substantially amorphous semiconductor, or substantially polycrystalline semiconductor.

6. The SAW resonator device as claimed in claim 1, wherein the surface region has a thickness that exceeds a thickness of an inversion channel in a known semiconductor substrate which has the layer disposed thereon.

7. The SAW resonator device of claim 1, wherein the surface region has a thickness within a range of approximately 1 nm and approximately 700 μm.

8. The SAW resonator device of claim 1, wherein the surface region comprises polycrystalline material with an average grain size of more than 10 times smaller than a thickness of the surface region.

9. The SAW resonator device of claim 8, wherein the average grain size is at least 10 times smaller than an area of the SAW resonator.

10. The SAW resonator device of claim 1, wherein the surface region comprises a layer of amorphous semiconductor material.

11. The SAW resonator device of claim 1, wherein the surface region comprises implanted ion atoms, which deteriorate a monocrystalline lattice structure of the semiconductor substrate.

12. The SAW resonator device as claimed in claim 1, wherein the plurality of features each have a height in a range of approximately 0.25 µm to approximately 1.5 µm.

13. The SAW resonator device as claimed in claim 1, wherein the plurality of features each have a height in a range of approximately 0.1 µm to approximately 2.50 µm.

14. The SAW resonator device as claimed in claim 1, wherein the plurality of features have a plurality of heights, and each of the pluralities of heights is approximately a height in a range of approximately one-fourth of a wavelength (¼λ) of one of the spurious modes.

15. The SAW resonator device as claimed in claim 1, wherein the plurality of features are substantially not in a regular pattern.

16. The SAW resonator device as claimed in claim 1, wherein the plurality of features each have a height of approximately one-fourth of a wavelength (¼λ) of a spurious mode.

17. A surface acoustic wave (SAW) filter comprising a plurality of the SAW resonator devices as recited in claim 1.

18. A surface acoustic wave (SAW) resonator device, comprising:
    a semiconductor substrate having a first surface and a second surface, the semiconductor substrate comprising a bulk region and a surface region wherein the surface region has a high trap density and a reduced carrier mobility compared to the bulk region, wherein the first surface of the semiconductor substrate comprises a plurality of features;
    a piezoelectric layer disposed over the semiconductor substrate, the piezoelectric layer having a first surface and a second surface;
    a plurality of electrodes disposed over the first surface of the piezoelectric layer, the plurality of electrodes configured to generate surface acoustic waves in the piezoelectric layer; and
    a layer having a first surface and a second surface, the layer being disposed between the first surface of the semiconductor substrate and the second surface of the piezoelectric layer, wherein the plurality of features each have a height of approximately one-fourth of a wavelength (¼λ) of a spurious mode, and the plurality of features reflect acoustic waves and reduce an incidence of spurious modes in the piezoelectric layer.

19. The SAW resonator device as claimed in claim 18, wherein the layer comprises an oxide material.

20. The SAW resonator device as claimed in claim 19, wherein the oxide material comprises silicon dioxide (SiO$_2$).

21. The SAW resonator device as claimed in claim 19, wherein the first surface of the layer has a root-mean-square (RMS) variation in height of approximately 0.1 Å to approximately 10.0 Å.

22. The SAW resonator device as claimed in claim 18, the first surface of the layer having a smoothness sufficient to foster atomic bonding between the first surface of the layer and the second surface of the piezoelectric layer.

23. The SAW resonator device as claimed in claim 18, wherein the surface region comprises a same material as the semiconductor substrate.

24. The SAW resonator device as claimed in claim 23, wherein the bulk region is a substantially monocrystalline semiconductor, and the surface region is substantially amorphous semiconductor, or substantially polycrystalline semiconductor.

25. A surface acoustic wave (SAW) resonator device, comprising:
    a semiconductor substrate having a first surface and a second surface, the semiconductor substrate comprising a bulk region and a surface region wherein the surface region has a high trap density and a reduced carrier mobility compared to the bulk region;
    a piezoelectric layer disposed over the semiconductor substrate, the piezoelectric layer having a first surface and a second surface, wherein the second surface of the piezoelectric layer comprises a plurality of features;
    a plurality of electrodes disposed over the first surface of the piezoelectric layer, the plurality of electrodes configured to generate surface acoustic waves in the piezoelectric layer; and
    a layer having a first surface and a second surface, the layer being disposed between the first surface of the semiconductor substrate and the second surface of the piezoelectric layer, wherein the plurality of features each have a height of approximately one-fourth of a wavelength (¼λ) of a spurious mode, and the plurality of features reflect acoustic waves and reduce an incidence of spurious modes in the piezoelectric layer.

26. The SAW resonator device as claimed in claim 25, wherein the plurality of features is a first plurality of features, and the first surface of the layer comprises a second plurality of features which engage the first plurality of features.

27. The SAW resonator device as claimed in claim 26, wherein the second plurality of features each have a height of approximately one-fourth of a wavelength (¼λ) of a spurious mode, and the second plurality of features reflect acoustic waves and reduce an incidence of spurious modes in the piezoelectric layer.

28. The SAW resonator device as claimed in claim 26, wherein each of the first plurality of features, and each of the second plurality of features have a height in a range of approximately 0.25 µm to approximately 1.5 µm.

29. The SAW resonator device as claimed in claim 25, wherein the layer comprises an oxide material.

30. The SAW resonator device as claimed in claim 29, wherein the oxide material comprises silicon dioxide (SiO$_2$).

31. The SAW resonator device as claimed in claim 25, the second surface of the layer having a smoothness sufficient to foster atomic bonding between the second surface of the layer and the first surface of the semiconductor substrate.

32. The SAW resonator device as claimed in claim 25, wherein the surface region comprises a same material as the semiconductor substrate.

33. The SAW resonator device as claimed in claim 32, wherein the bulk region is a substantially monocrystalline semiconductor, and the surface region is substantially amorphous semiconductor, or substantially polycrystalline semiconductor.

34. The SAW resonator device as claimed in claim 25, wherein the plurality of features each have a height in a range of approximately 0.25 µm to approximately 1.5 µm.

* * * * *